(12) United States Patent
Kim et al.

(10) Patent No.: US 7,936,432 B2
(45) Date of Patent: May 3, 2011

(54) DISPLAY DEVICE

(75) Inventors: Dowan Kim, Gumi (KR); Changhyung Lee, Gumi (KR)

(73) Assignee: LG Display Co., Ltd., Seoul (KR)

( * ) Notice: Subject to any disclaimer, the term of this patent is extended or adjusted under 35 U.S.C. 154(b) by 394 days.

(21) Appl. No.: 11/952,723

(22) Filed: Dec. 7, 2007

(65) Prior Publication Data

US 2008/0291349 A1 Nov. 27, 2008

(30) Foreign Application Priority Data

May 21, 2007 (KR) .................. 10-2007-0049388

(51) Int. Cl.
*G02F 1/1345* (2006.01)
(52) U.S. Cl. ....................... 349/152; 349/149
(58) Field of Classification Search ............ None
See application file for complete search history.

(56) References Cited

U.S. PATENT DOCUMENTS

| 3,998,526 | A | * | 12/1976 | Katz | 349/113 |
| 5,677,712 | A | * | 10/1997 | Murahashi | 345/205 |
| 6,476,505 | B2 | * | 11/2002 | Nakamura | 257/786 |
| 7,411,216 | B2 | * | 8/2008 | Kim et al. | 257/72 |
| 2004/0165138 | A1 | * | 8/2004 | Hwang et al. | 349/152 |

* cited by examiner

*Primary Examiner* — Lucy P Chien
(74) *Attorney, Agent, or Firm* — Morgan, Lewis & Bockius LLP

(57) ABSTRACT

A display device includes a substrate, a display unit on the substrate, the display unit including a plurality of subpixels, a driver that applies a driving signal to the display unit, a pad unit that applies an electric signal received from the outside to the driver; a plurality of lines that connects the display unit to the driver or the pad unit to the driver; and a plurality of pad electrodes disposed at one ends of the lines connected to the driver. A width of one end of the pad electrode connected to the lines is narrower than widths of other areas of the pad electrode excepting the other end of the pad electrode.

18 Claims, 10 Drawing Sheets

(a)     (b)     (c)

DISPLAY DEVICE

This application claims the benefit of Korean Patent Application No. 10-2007-0049388 filed on May 21, 2007, which is hereby incorporated by reference.

BACKGROUND OF THE DISCLOSURE

1. Field of the Disclosure

Exemplary embodiments relate to a display device.

2. Description of the Related Art

The importance of display devices has recently increased with the growth of multimedia. Various types of display devices such as liquid crystal displays (LCDs), plasma display panels (PDPs), field emission displays (FEDs), and organic light emitting devices have been put to practical use.

Among them, the LCD and the light emitting device have come into the spotlight as a next generation display device because of the advantages of the LCD and the light emitting device. The LCD has better visibility than a cathode-ray tube, has low average power consumption, and generates less heat. The light emitting device has fast response speed, for example, about 1 ms, has low average power consumption, and does not have a viewable angle problem because the light emitting device is a self emitting device.

Such a display device is driven based on one of a passive matrix method and an active matrix method using a thin film transistor. In the passive matrix method, anodes and cathodes are formed orthogonally, and a display device is driven by selecting predetermined lines. On the contrary, in the active matrix method, a thin film transistor is connected to each pixel electrode, and the display device is driven according to a voltage sustained by a capacitor connected to a gate electrode of the thin film transistor.

A display device includes a display unit for displaying images and a driver for driving the display unit. The driver includes a printed circuit board (PCB) including parts for generating various control signal and data signals. The driver also includes a driving integrated circuit for applying a signal to lines of a display panel.

The driver may be classified into a chip-on-glass (OCG) type, a tape carrier package (TCP) type, and a chip-on-film (COF) type according to a method of packaging the driving integrated circuit into a panel. Among them, the COF type is widely used for a small sized panel because the COF has a simple structure and can increase a ratio of a display area in a display panel.

In a display device including a COG type driver, a pad unit includes a display unit, a line connected to a driving chip, a driver, and a pad electrode disposed at one end of the line. The driver is disposed on the pad unit through an anisotropic conductive film (ACF).

A pad electrode and a driver may be formed by coating an ACF on the pad electrode and compressing the driver on the pad electrode. Since a pad electrode according to the related art generally has a rectangular shape or a square shape, the flow of the ACF at the corners of a pad electrode when the driver is compressed with the ACF. As a result, conductive balls of an ACF lump together.

Therefore, short occurs between pad electrodes, and the reliability of a display device is deteriorated.

SUMMARY OF THE DISCLOSURE

Exemplary embodiments provide a display device capable of improving the reliability of the display device by preventing short between pad electrodes.

In one aspect, a display device includes a substrate, a display unit on the substrate, the display unit including a plurality of subpixels, a driver that applies a driving signal to the display unit, a pad unit that applies an electric signal received from the outside to the driver; a plurality of lines that connects the display unit to the driver or the pad unit to the driver; and a plurality of pad electrodes disposed at one ends of the lines connected to the driver. A width of one end of the pad electrode connected to the lines is narrower than widths of other areas of the pad electrode excepting the other end of the pad electrode.

In another aspect, a display device includes a substrate, a display unit on the substrate, the display unit including a plurality of subpixels, a driver that applies a driving signal to the display unit, a pad unit that applies an electric signal received from the outside to the driver; a plurality of lines that connects the display unit to the driver or the pad unit to the driver and a plurality of pad electrodes disposed at one ends of the lines connected to the driver, the pad electrode including a first pad electrode disposed at a column close to the display unit and a second pad electrode disposed at a column father from the display unit than the first pad electrode. A width of one end of the first pad electrode close to the second pad electrode is narrower than a width of other area of the first pad electrode excepting the other end of the first pad electrode, and a width of one end of the second pad electrode connected to the line is narrower than a width of other area of the second pad electrode excepting the other end of the second pad electrode.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION OF EMBODIMENTS

Reference will now be made in detail embodiments of the invention examples of which are illustrated in the accompanying drawings.

Figure 1:
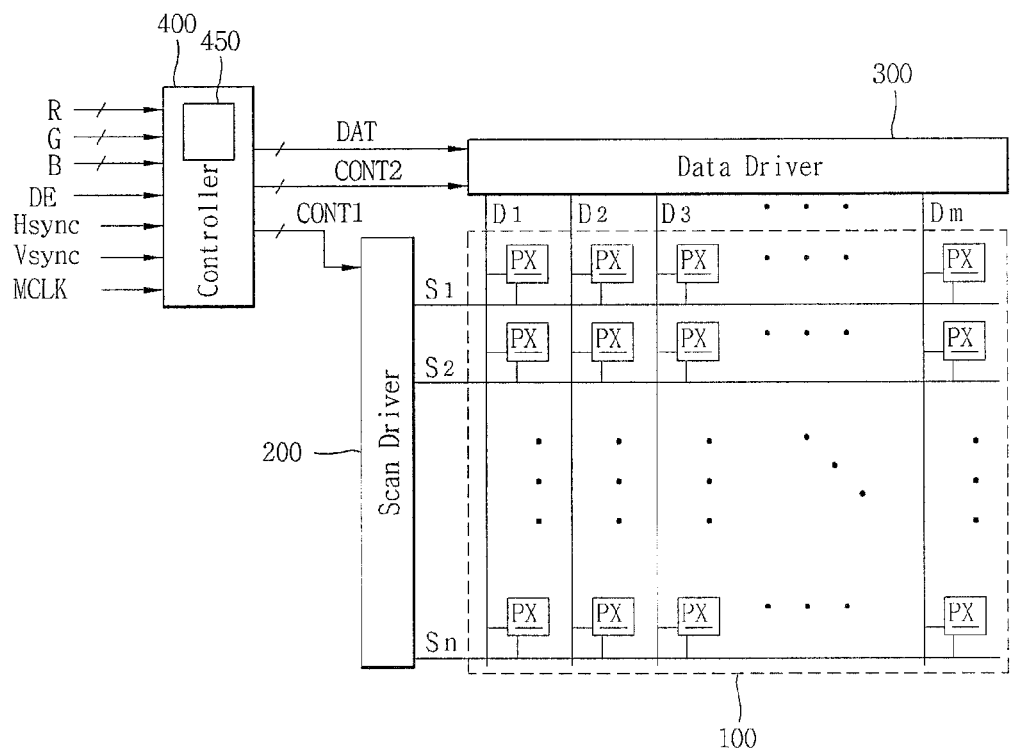
FIG. 1 is a bock diagram of a display device according to an exemplary embodiment.
Figure 2:
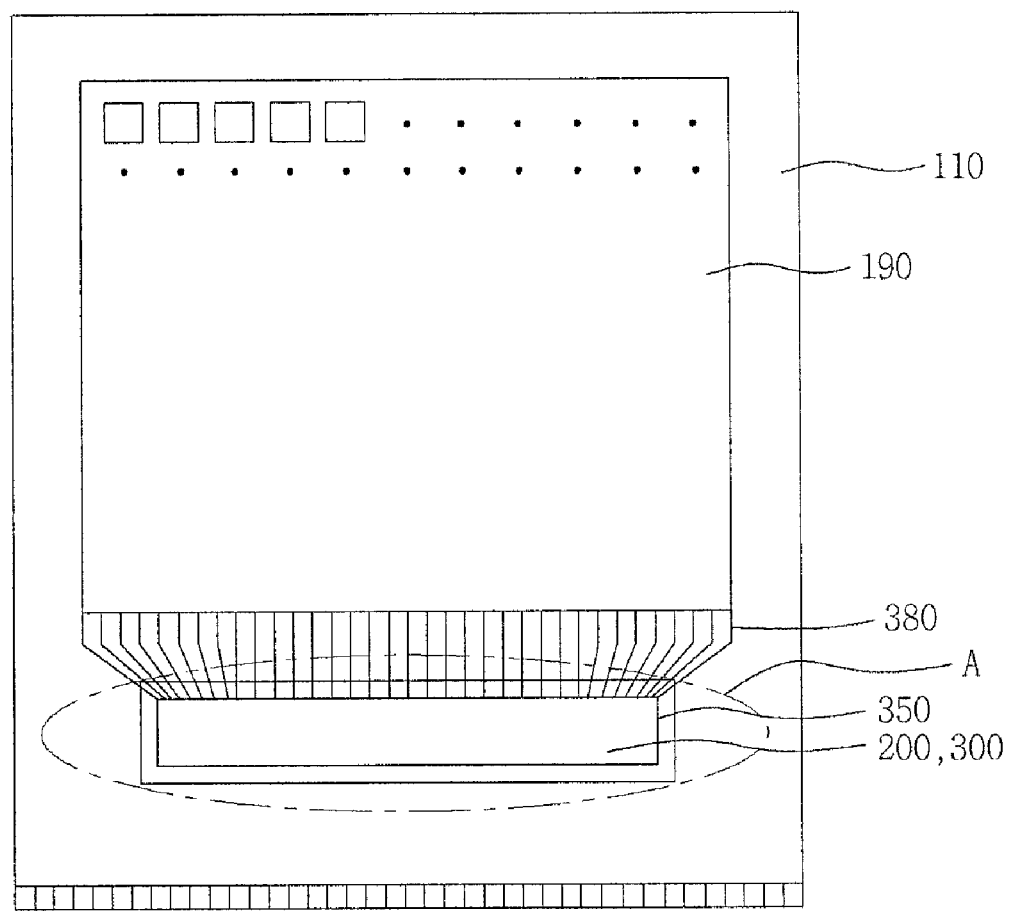
FIG. 2 is a plan view of the display device according to the exemplary embodiment.
Figure 3A:
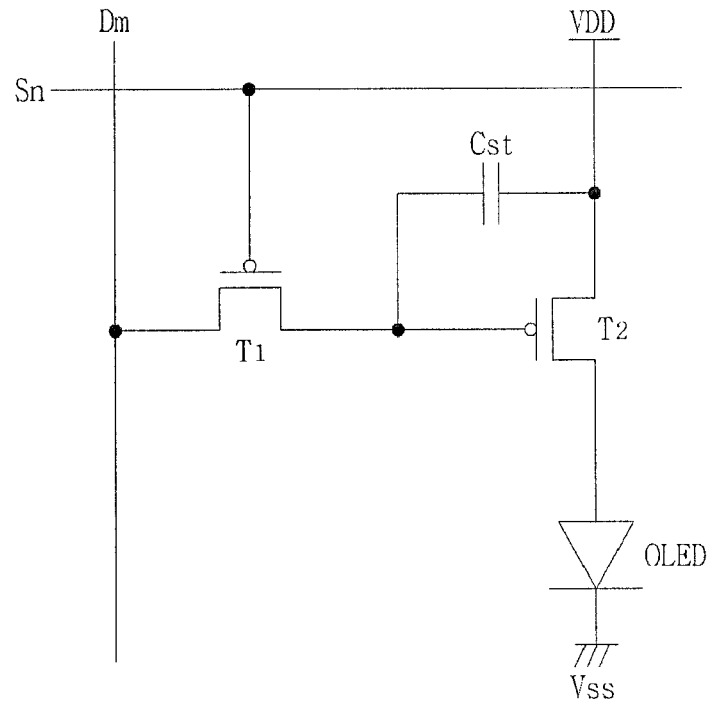
FIGS. 3A and 3B are circuit diagrams of a subpixel of the display device according to the exemplary embodiment.
Figure 3B:
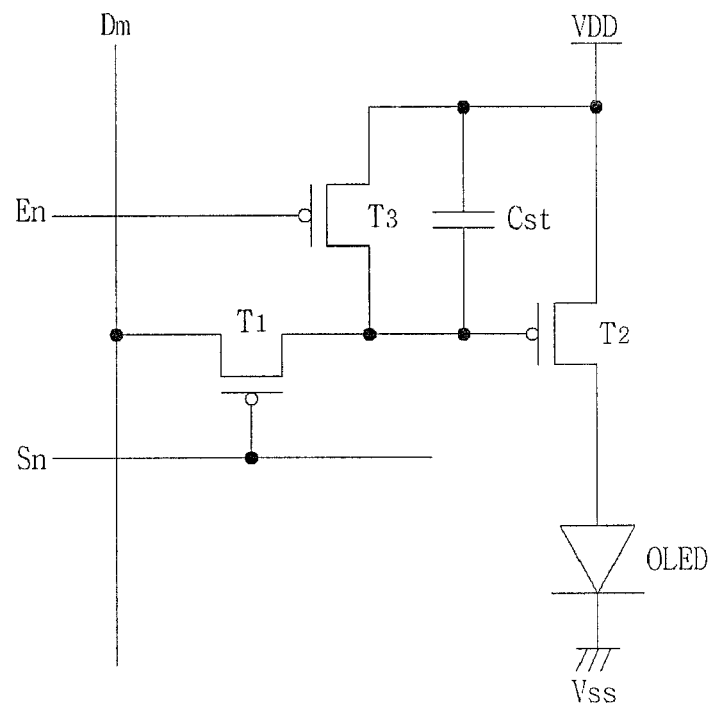

FIG. 1 is a bock diagram of a display device according to an exemplary embodiment, FIG. 2 is a plan view of the display device according to the exemplary embodiment, and FIGS. 3A and 3B are circuit diagrams of a subpixel of the display device according to the exemplary embodiment.

As shown in FIG. 1, the display device according to the exemplary embodiment includes a display panel 100, a driver including a scan driver 200 and a data driver 300, and a controller 400.

The display panel 100 includes a plurality of signal lines S1 to Sn and D1 to Dm, a plurality of power supply lines (not shown), and a plurality of subpixels PX connected to the signal lines S1 to Sn and D1 to Dm and the power supply lines in a matrix form.

The plurality of signal lines S1 to Sn and D1 to Dm may include the plurality of scan lines S1 to Sn for sending scan signals and the plurality of data lines D1 to Dm for sending data signals. Each power supply line may send voltages such as a power voltage VDD to each subpixel PX.

Although the signal lines include the scan lines S1 to Sn and the data lines D1 to Dm in FIG. 1, the exemplary embodiment is not limited thereto. The signal lines may further include erase lines (not shown) for sending erase signals depending on a driving manner.

However, an erase line may not be used to send an erase signal. The erase signal may be sent through another signal line. For instance, although it is not shown, the erase signal may be supplied to the display panel 100 through the power supply line in case that the power supply line for supplying the power voltage VDD is formed.

As shown in FIG. 2, the display device includes a substrate 110, a display unit 190 including a plurality of subpixels on the substrate 110, the drivers 200 and 300 for applying a driving signal to the display unit 190, a pad unit 350 for applying an electrical signal received from the outside to the drivers 200 and 300, a plurality of lines 380 for connecting the display unit 190 to the drivers 200 and 300 or for connecting the pad unit 350 to the drivers 200 and 300, and a plurality of pad electrodes (not shown) positioned at one end of the lines 380 connected to the driver 370. The drivers 200 and 300 may have a form of a chip including an integrated circuit. Although it is not shown, a flexible printed circuit (FPC) may be connected to the pad unit 350.

As shown in FIG. 3A, the subpixel may include a switching thin film transistor T1 for sending the data signal in response to the scan signal sent through the scan line Sn, a capacitor Cst for storing the data signal, a driving thin film transistor T2 producing a driving current corresponding to a voltage difference between the data signal stored in the capacitor Cst and the power voltage VDD, and an organic light emitting diode (OLED) emitting light corresponding to the driving current.

As shown in FIG. 3B, the subpixel may include a switching thin film transistor T1 for sending the data signal in response to the scan signal sent through the scan line Sn, a capacitor Cst for storing the data signal, a driving thin film transistor T2 producing a driving current corresponding to a voltage difference between the data signal stored in the capacitor Cst and the power voltage VDD, an organic light emitting diode (OLED) emitting light corresponding to the driving current, and an erase switching thin film transistor T3 for erasing the data signal stored in the capacitor Cst in response to an erase signal sent through an erase line En.

When the display device is driven in a digital driving manner that represents a gray scale with one frame being divided into a plurality of subfields, the pixel circuit of FIG. 3B can control an emission time by supplying an erase signal to a subfield whose a light-emission time is shorter than an addressing time. The pixel circuit of FIG. 2B has an advantage capable of reducing a lowest luminance of the display device.

A difference between driving voltages, e.g., the power voltages VDD and Vss of the display device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

Referring again to FIG. 1, the scan driver 200 is connected to the scan lines S1 to Sn of the display panel 100 to apply scan signals capable of taming on the switching thin film transistor T1 to the scan lines S1 to Sn, respectively.

The data driver 300 is connected to the data lines D1 to Dm of the display panel 100 to apply data signals indicating an output video signal DAT' to the data lines D1 to Dm, respectively. The data driver 300 may include at least one data driving integrated circuit (IC) connected to the data lines D1 to Dm.

The data driving IC may include a shift register, a latch, a digital-to-analog (DA) converter, and an output buffer connected to one another in the order named.

When a horizontal sync start signal (STH) (or a shift clock signal) is received, the shift register can send the output video signal DAT' to the latch in response to a data clock signal (HLCK). In case that the data driver 300 includes a plurality of data driving ICs, a shift register of a data driving IC can send a shift clock signal to a shift register of a next data driving IC.

The latch memorizes the output video signal DAT', selects a gray voltage corresponding to the memorized output video signal DAT' in response to a load signal, and sends the gray voltage to the output buffer.

The DA converter selects the corresponding gray voltage in response to the output video signal DAT' and sends the gray voltage to the output buffer.

The output buffer outputs an output voltage (serving as a data signal) received from the DA converter to the data lines D1 to Dm, and maintains the output of the output voltage for 1 horizontal period (1H).

The controller 400 controls an operation of the scan driver 200 and an operation of the data driver 300. The controller 400 may include a signal conversion unit 450 that gamma-converts input video signals R, G and B into the output video signal DAT' and produces the output video signal DAT'.

The controller 400 produces a scan control signal CONT1 and a data control signal CONT2, and the like. Then, the controller 400 outputs the scan control signal CONT1 to the scan driver 200 and outputs the data control signal CONT2 and the processed output video signal DAT' to the data driver 300.

The controller 400 receives the input video signals R, G and B and an input control signal for controlling the display of the input video signals R, G and B from a graphic controller (not shown) outside the display device. Examples of the input control signal include a vertical sync signal Vsync, a horizontal sync signal Hsync, a main clock signal MCLK and a data enable signal DE.

Each of the driving devices 200, 300 and 400 may be directly mounted on the display panel 100 in the form of at least one IC chip, or may be attached to the display panel 100 in the form of a tape carrier package (TCP) in a state where the driving devices 200, 300 and 400 each are mounted on a flexible printed circuit film (not shown), or may be mounted on a separate printed circuit board (not shown).

Alternatively, each of the driving devices 200, 300 and 400 may be integrated on the display panel 100 together with the plurality of signal lines S1 to Sn and D1 to Dm or the thin film transistors T1, T2 and T3, and the like.

Further, the driving devices 200, 300 and 400 may be integrated into a single chip. In this case, at least one of the driving devices 200, 300 and 400 or at least one circuit element constituting the driving devices 200, 300 and 400 may be positioned outside the single chip.

Figure 4:
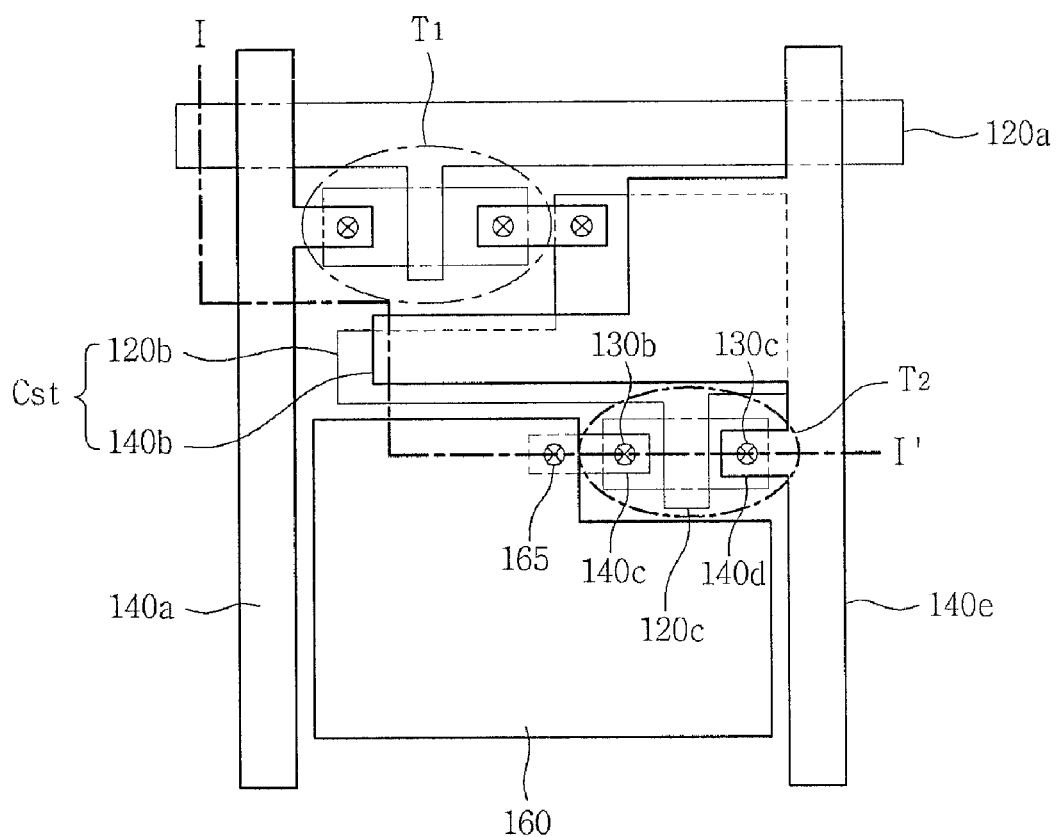
FIG. 4 is a plane view showing a structure of the subpixel of the display device according to the exemplary embodiment.
Figure 5A:
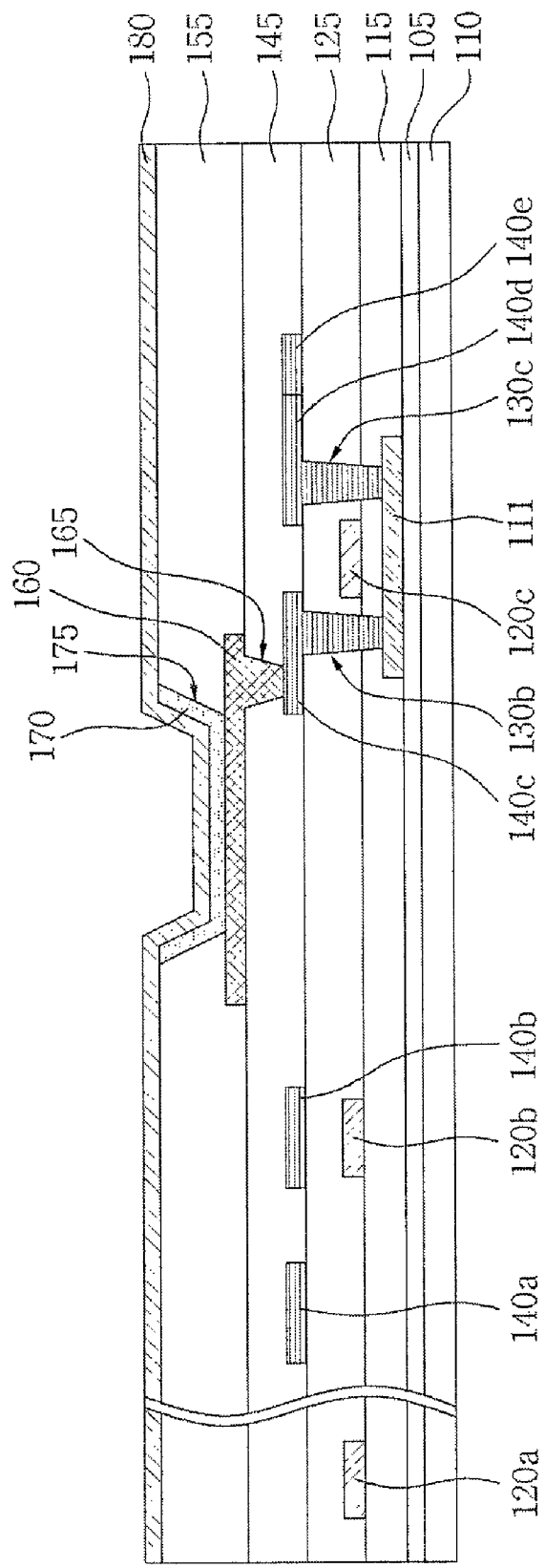
FIGS. 5A and 5B are cross-sectional views taken along line I-I' of FIG. 4.
Figure 5B:
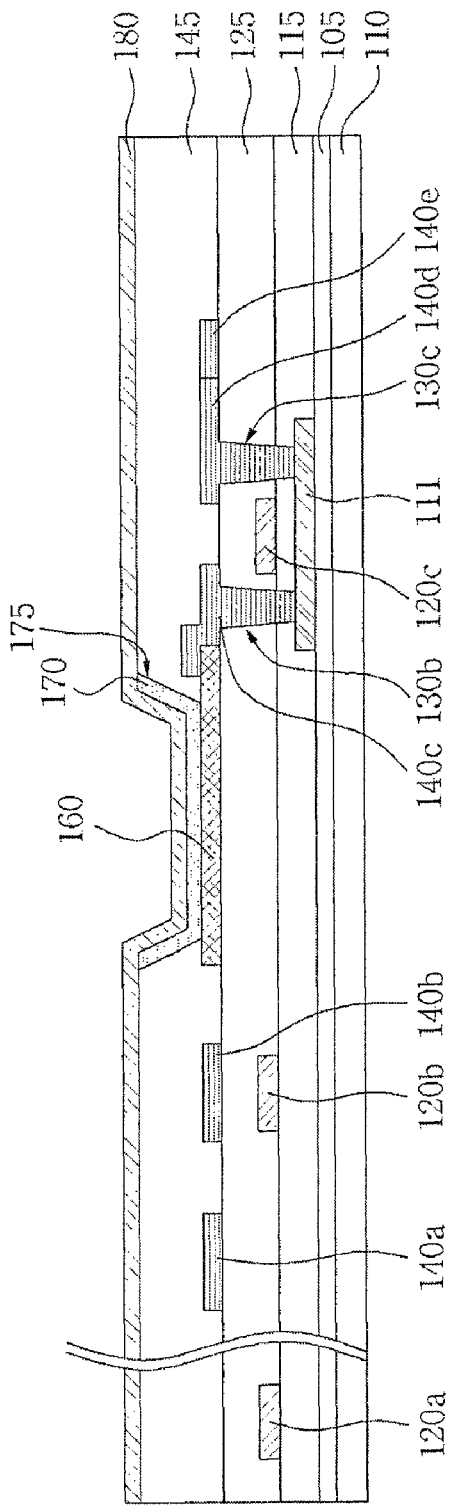

FIGS. 4, 5A and 5B show a structure of a subpixel of the display device according to the exemplary embodiment. This structure includes the substrate 110 having a plurality of subpixel and non-subpixel areas. As shown, for instance, in FIG. 4, the subpixel area and the non-subpixel area may be defined by a scan line 120a that extends in one direction, a data line 140a that extends substantially perpendicular to the scan line 120a, and a power supply line 140e that extends substantially parallel to the data line 140a.

The subpixel area may include a switching thin film transistor T1 connected to the scan line 120a and the data line 140a, a capacitor Cst connected to the switching thin film transistor T1 and the power supply line 140e, and a driving thin film transistor T2 connected to the capacitor Cst and the power supply line 140e. The capacitor Cst may include a capacitor lower electrode 120b and a capacitor upper electrode 140b.

The subpixel area may also include an organic light emitting diode, which includes a first electrode 160 electrically connected to the driving thin film transistor T2, an emitting layer (not shown) on the first electrode 160, and a second electrode (not shown). The non-subpixel area may include the scan line 120a, the data line 140a and the power supply line 140e.

FIGS. 5A and 5B are cross-sectional views taken along line I-I' of FIG. 4.

As shown in FIG. 5A, a buffer layer 105 is positioned on the substrate 110. The buffer layer 105 prevents impurities (e.g., alkali ions discharged from the substrate 110) from being introduced during formation of the thin film transistor in a succeeding process. The buffer layer 105 may be selectively formed using silicon oxide ($SiO_2$), silicon nitride (SiNX), or using other materials. The substrate 110 may be formed of glass, plastic or metal.

A semiconductor layer 111 is positioned on the buffer layer 105. The semiconductor layer 111 may include amorphous silicon or crystallized polycrystalline silicon. The semiconductor layer 111 may include a source area and a drain area including p-type or n-type impurities. The semiconductor layer 111 may include a channel area in addition to the source area and the drain area.

A first insulating layer 115, which may be a gate insulating layer, is positioned on the semiconductor layer 111. The first insulating layer 115 may include a silicon oxide ($SiO_x$) layer, a silicon nitride ($SiN_x$) layer, or a multi-layered structure or a combination thereof.

A gate electrode 120c is positioned on the first insulating layer 115 in a given area of the semiconductor layer 111, e.g., at a location corresponding to the channel area of the semiconductor layer 111 when impurities are doped. The scan line 120a and the capacitor lower electrode 120b may be positioned on the same formation layer as the gate electrode 120c.

The gate electrode 120c may be formed of any one selected from the group consisting of molybdenum (Mo), aluminum (Al), chromium (Cr), gold (Au), titanium (Ti), nickel (Ni), neodymium (Nd) and copper (Cu), or a combination thereof. The gate electrode 120c may have a multi-layered structure formed of Mo, Al, Cr, Au, Ti, Ni, Nd, or Cu, or a combination thereof. The gate electrode 120c may have a double-layered structure including Mo/Al—Nd or Mo/Al.

The scan line 120a may be formed of any one selected from the group consisting of Mo, Al, Cr, Au, Ti, Ni, Nd, or Cu, or a combination thereof. The scan line 120a may have a multi-layered structure formed of Mo, Al, Cr, Au, Ti, Ni, Nd, or Cu, or a combination thereof. The scan line 120a may have a double-layered structure including Mo/Al—Nd or Mo/Al.

A second insulating layer 125, which may be an interlayer insulating layer, is positioned on the substrate 110 on which the scan line 120a, the capacitor lower electrode 120b and the gate electrode 120c are positioned. The second insulating layer 125 may include a silicon oxide ($SiO_x$) layer, a silicon nitride ($SiN_x$) layer, or a multi-layered structure or a combination thereof.

Contact holes 130b and 130c are positioned inside the second insulating layer 125 and the first insulating layer 115 to expose a portion of the semiconductor layer 111.

A drain electrode 140c and a source electrode 140d are positioned in the subpixel area to be electrically connected to the semiconductor layer 111 through the contact holes 130b and 130c passing through the second insulating layer 125 and the first insulating layer 115.

The drain electrode 140c and the source electrode 140d may have a single-layered structure or a multi-layered structure. When the drain electrode 140c and the source electrode 140d have the single-layered structure, the drain electrode 140c and the source electrode 140d may be formed of Mo, Al, Cr, Au, Ti, Ni, Nd, or Cu, or a combination thereof.

When the drain electrode 140c and the source electrode 140d have the multi-layered structure, the drain electrode 140c and the source electrode 140d may have a double-layered structure including Mo/Al—Nd or a triple-layered structure including Mo/Al/Mo or Mo/Al—Nd/Mo.

The data line 140a, the capacitor upper electrode 140b, and the power supply line 140e may be positioned on the same formation layer as the drain electrode 140c and the source electrode 140d.

The data line 140a and the power supply line 140e positioned in the non-subpixel area may have a single-layered structure or a multi-layered structure. When the data line 140a and the power supply line 140e have the single-layered structure, the data line 140a and the power supply line 140e may be formed of Mo, Al, Cr, Au, Ti, Ni, Nd, or Cu, or a combination thereof.

When the data line 140a and the power supply line 140e have the multi-layered structure, the data line 140a and the power supply line 140e may have a double-layered structure including Mo/Al—Nd or a triple-layered structure including Mo/Al/Mo or Mo/Al—Nd/Mo. The data line 140a and the power supply line 140e may have a triple-layered structure including Mo/Al—Nd/Mo.

A third insulating layer 145 is positioned on the data line 140a, the capacitor upper electrode 104b, the drain electrode 140c, the source electrode 140d, and the power supply line 140e. The third insulating layer may be formed of an organic material such as polyimide, benzocyclobutene-based resin and acrylate or an inorganic material such as spin on glass (SOG) obtained by spin-coating silicone oxide ($SiO_2$) in the liquid form and solidifying it. Otherwise, the third insulating layer 145 may be a passivation layer, and may include a silicon oxide ($SiO_X$) layer, a silicon nitride ($SiN_X$) layer, or a multi-layered structure including a combination thereof.

A via hole 165 is positioned inside the third insulating layer 145 to expose any one of the source and drain electrodes 140c and 140d. The first electrode 160 is positioned on the third insulating layer 145 to be electrically connected to any one of the source and drain electrodes 140c and 140d via the via hole 165.

The first electrode 160 may be an anode electrode, and may be a transparent electrode or a reflection electrode. When the display device has a bottom emission or dual emission structure, the first electrode 160 may be a transparent electrode formed of one of indium-tin-oxide (ITO), indium-zinc-oxide (IZO) and zinc oxide (ZnO). When the display device has a top emission structure, the first electrode 160 may be a reflection electrode. In this case, a reflection layer formed of one of Al, Ag and Ni may be positioned under a layer formed of one of ITO, IZO and ZnO, and also the reflection layer formed of one of Al, Ag and Ni may be positioned between two layers formed of one of ITO, IZO and ZnO.

A fourth insulating layer 155 including an opening 175 is positioned on the first electrode 160. The opening 175 provides electrical insulation between the neighboring first electrodes 160 and exposes a portion of the first electrode 160. An emitting layer 170 is positioned on the first electrode 160 exposed by the opening 175.

A second electrode 180 is positioned on the emitting layer 170. The second electrode 180 may be a cathode electrode, and may be formed of Mg, Ca, Al and Ag having a low work function or a combination thereof.

When the display device has a top emission or dual emission structure, the second electrode 180 may be thin enough to transmit light. When the display device has a bottom emission structure, the second electrode 180 may be thick enough to reflect light.

The display device according to the exemplary embodiment using a total of 7 masks was described as an example. The 7 masks may be used in a process for forming each of the semiconductor layer, the gate electrode (including the scan line and the capacitor lower electrode), the contact holes, the source and drain electrodes (including the data line, the power supply line and the capacitor upper electrode), the via holes, the first electrode, and the opening.

An example of how a display device is formed using a total of 5 masks will now be given.

As shown in FIG. 5B, the buffer layer 105 is positioned on the substrate 110, and the semiconductor layer 111 is positioned on the buffer layer 105. The first insulating layer 115 is positioned on the semiconductor layer 111. The gate electrode 120c, the capacitor lower electrode 120b, and the scan line 120a are positioned on the first insulating layer 115. The second insulating layer 125 is positioned on the gate electrode 120c.

The first electrode 160 is positioned on the second insulating layer 125, and the contact holes 130b and 130c are positioned to expose the semiconductor layer 111. The first electrode 160 and the contact holes 130b and 130c may be simultaneously formed.

The source electrode 140d, the drain electrode 140c, the data line 140a, the capacitor upper electrode 140b, and the power supply line 140e are positioned on the second insulating layer 125. A portion of the drain electrode 140c maybe positioned on the first electrode 160.

A pixel or subpixel definition layer or the third insulating layer 145, which may be a bank layer, is positioned on the substrate 110 on which the above-described structure is formed. The opening 175 is positioned on the third insulating layer 145 to expose the first electrode 160. The emitting layer 170 is positioned on the first electrode 160 exposed by the opening 175, and the second electrode 180 is positioned on the emitting layer 170.

The aforementioned display device can be manufactured using a total of 5 masks. The 5 masks are used in a process for forming each of the semiconductor layer, the gate electrode (including the scan line and the capacitor lower electrode), the first electrode (including the contact holes), the source and drain electrodes (including the data line, the power supply line and the capacitor upper electrode), and the opening. Accordingly, the display device according to the exemplary embodiment can reduce the manufacturing cost by a reduction in the number of masks and can improve the efficiency of mass production.

Various color image display methods may be implemented in the display device such as described above. These methods will be described below with reference to FIGS. 6A to 6C.

Figure 6A:
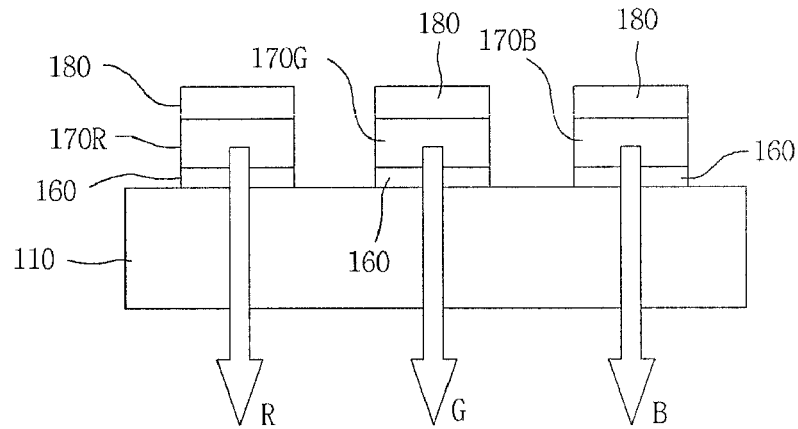
FIGS. 6A to 6C illustrate various implementations of a color image display method in the display device according to the exemplary embodiment.
Figure 6B:
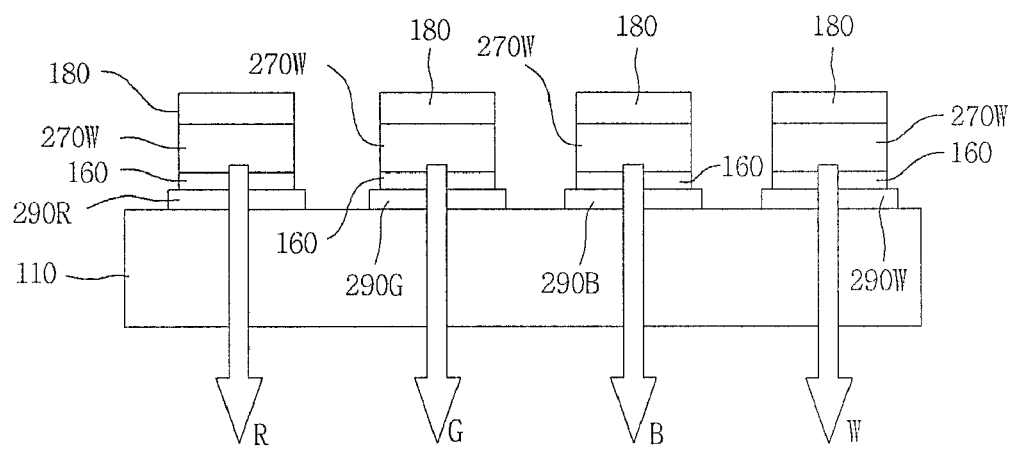
Figure 6C:
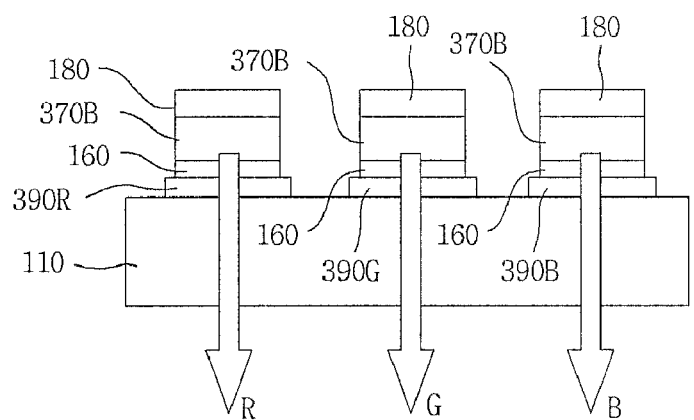

FIGS. 6A to 6C illustrate various implementations of a color image display method in the display device according to the exemplary embodiment.

FIG. 6A illustrates a color image display method in a display device separately including a red emitting layer 170R, a green emitting layer 170G and a blue emitting layer 170B which emit red, green and blue light, respectively.

The red, green and blue light produced by the red, green and blue emitting layers 170R, 170G and 170B is mixed to display a color image.

It may be understood in FIG. 6A that the red, green and blue emitting layers 170R, 170G and 170B each include an electron transporting layer, a hole transporting layer, and the like, on upper and lower portions thereof. It is possible to variously change the arrangement and the structure between the additional layers such as the electron transporting layer and the hole transporting layer and each of the red, green and blue emitting layers 170R, 170G and 170B.

FIG. 6B illustrates a color image display method in a display device including a white emitting layer 270W, a red color filter 290R, a green color filter 290G, a blue color filter 290B, and a white color filter 290W.

As shown in FIG. 6B, the red color filter 290R, the green color filter 290G and the blue color filter 290B each transmit white light produced by the white emitting layer 270W to produce red light, green light and blue light. The red, green and blue light is mixed to display a color image. The white color filter 290W may be removed depending on color sensitivity of the white light produced by the white emitting layer 270W and combination of the white light and the red, green and blue light.

While FIG. 6B has illustrated the color display method of four subpixels using combination of the red, green, blue, and white light, a color display method of three subpixels using combination of the red, green, and blue light may be used.

It may be understood in FIG. 6B that the white emitting layer 270W includes an electron transporting layer, a hole transporting layer, and the like, on upper and lower portions thereof. It is possible to variously change the arrangement and the structure between the additional layers such as the electron transporting layer and the hole transporting layer and the white emitting layer 270W.

FIG. 6C illustrates a color image display method in a display device including a blue emitting layer 370B, a red color change medium 390R, a green color change medium 390G, a blue color change medium 390B.

As shown in FIG. 6C, the red color change medium 390R, the green color change medium 390G, and the blue color change medium 390B each transmit blue light produced by the blue emitting layer 370B to produce red light, green light and blue light. The red, green and blue light is mixed to display a color image.

The blue color change medium 390B may be removed depending on color sensitivity of the blue light produced by the blue emitting layer 370B and combination of the blue light and the red and green light.

It may be understood in FIG. 6C that the blue emitting layer 370B includes an electron transporting layer, a hole transporting layer, and the like, on upper and lower portions thereof. It is possible to variously change the arrangement and the structure between the additional layers such as the electron transporting layer and the hole transporting layer and the blue emitting layer 370B.

While FIGS. 6A and 6B have illustrated and described the display device having a bottom emission structure, the exemplary embodiment is not limited thereto. The display device according to the exemplary embodiment may have a top emission structure, and thus the structure of the display device according to the exemplary embodiment may be changed depending on the top emission structure.

While FIGS. 6A to 6C have illustrated and described three kinds of color image display method, the exemplary embodiment is not limited thereto. The exemplary embodiment may use various kinds of color image display method whenever necessary.

Figure 7:
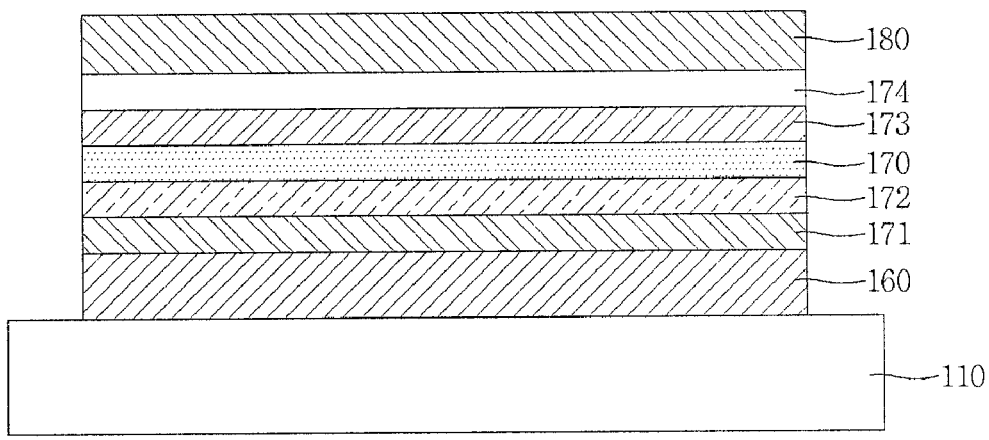
FIG. 7 is a cross-sectional view of the display device according to the exemplary embodiment.

FIG. 7 is a cross-sectional view of the display device according to the exemplary embodiment.

As shown in FIG. 7, the display device according to the exemplary embodiment includes the substrate 110 the first electrode 160 positioned on the substrate 110, a hole injection layer 171 positioned on the first electrode 160, a hole transporting layer 172, an emitting layer 170, an electron transporting layer 173, an electron injection layer 174, and the second electrode 180 positioned on the electron injection layer 174.

The hole injection layer 171 may function to facilitate the injection of holes from the first electrode 160 to the emitting layer 170. The hole injection layer 171 may be formed of at least one selected from the group consisting of copper phthalocyanine (CuPc), PEDOT(poly(3,4)-ethylenedioxyhiophene), polyaniline (PANI) and NPD(N,N-dinaphthyl-N, N'-diphenyl benzidine), but is not limited thereto. The hole injection layer 171 may be formed using an evaporation method or a spin coating method.

The hole transporting layer 172 functions to smoothly transport holes. The hole transporting layer 172 may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine). s-TAD and MTDATA(4,4',4"-Tris(N-3-methylphenyl-N-phenyl-amino)-triphenylamine), but is not limited thereto. The hole transporting layer 172 may be formed using an evaporation method or a spin coating method.

The emitting layer 170 may be formed of a material capable of producing red, green, blue or white light such as, for example, a phosphorescence material or a fluorescence material.

In case that the emitting layer 170 emits red light, the emitting layer 170 includes a host material including carbazole biphenyl (CBP) or N,N-dicarbazolyl-3,5-benzene (mCP). Further, the emitting layer 170 may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the emitting layer 170 emits green light, the emitting layer 170 includes a host material including CBP or mCP. Further, the emitting layer 170 may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case that the emitting layer 170 emits blue light, the emitting layer 170 includes a host material including CBP or mCP. Further, the emitting layer 170 may be formed of a phosphorescence material including a dopant material including (4,6-F2ppy)2Irpic or a fluorescence material including any one selected from the group consisting of spiro-DPVBi, spiro-6P, distyryl-benzene (DSB), distyryl-arylene (DSA), PFO-based polymers, PPV-based polymers and a combination thereof, but is not limited thereto.

The electron transporting layer 173 functions to facilitate the transportation of electrons. The electron transporting layer 173 may be formed of at least one selected from the group consisting of Alq3(tris(8-hydroxyquinolino)aluminum, PBD, TAZ, spiro-PBD, BAlq, and SAlq, but is not limited thereto. The electron transporting layer 173 may be formed using an evaporation method or a spin coating method.

The electron transporting layer 173 can also function to prevent holes, which are injected from the first electrode 160 and then pass through the emitting layer 170, from moving to the second electrode 180. In other words, the electron transporting layer 173 serves as a hole stop layer, which facilitates the coupling of holes and electrons in the emitting layer 170.

The electron injection layer 174 functions to facilitate the injection of electrons. The electron injection layer 174 may be formed of Alq3(tris(8-hydroxyquinolino)aluminum), PBD, TAZ, spiro-PBD, BAlq or SAlq, but is not limited thereto.

The electron injection layer 174 may be formed of an organic material and an inorganic material forming the electron injection layer 174 through a vacuum evaporation method.

The hole injection layer 171 or the electron injection layer 174 may further include an inorganic material. The inorganic material may further include a metal compound. The metal compound may include alkali metal or alkaline earth metal.

The metal compound including the alkali metal or the alkaline earth metal may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, but is not limited thereto.

Thus, the inorganic material inside the electron injection layer 174 facilitates hopping of electrons injected from the second electrode 180 to the emitting layer 170, so that holes and electrons injected into the emitting layer 170 are balanced. Accordingly, emission efficiency can be improved.

Further, the inorganic material inside the hole injection layer 171 reduces the mobility of holes injected from the first electrode 160 to the emitting layer 170, so that holes and electrons injected into the emitting layer 170 are balanced. Accordingly, emission efficiency can be improved.

At least one of the electron injection layer 174, the electron transporting layer 173, the hole transporting layer 172, the hole injection layer 171 may be omitted.

The driver and the pad unit of the display device will be described below with reference to FIGS. 8 to 12.

Figure 8:
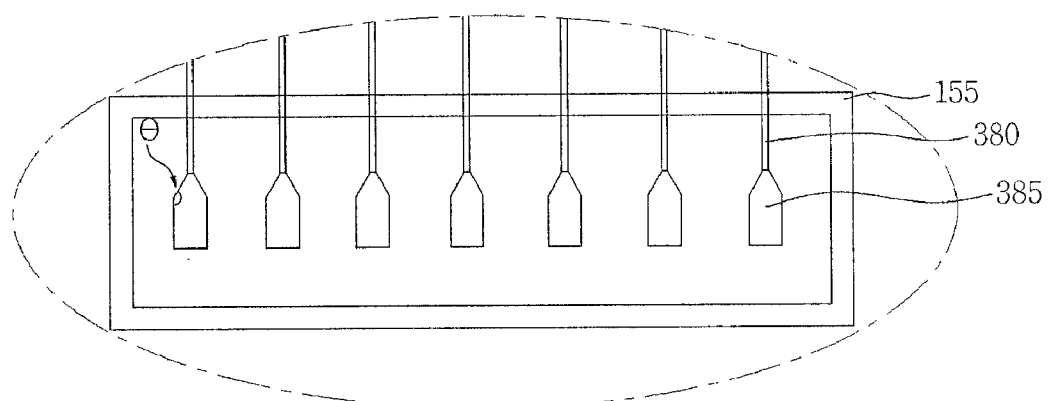
FIG. 8 is a plane view of an area A of FIG. 2.

FIG. 8 is a plane view of an area A of FIG. 2.

As shown in FIG. 8, the pad unit 350 includes a plurality of lines 380 which are spaced apart from one another at a predetermined interval in one direction. The pad unit 350 applies a predetermined driving signal, for example, a data signal to the display unit 200.

A pad electrode 385 is disposed at one end of each line 380 connected to the driver 370. A fourth insulating layer 155 is disposed around the pad unit 350 and exposes the pad unit 350 to connect the pad electrodes 385 to the driver 370 in later.

One end of the pad electrode 385 connected to the line 380 may be narrower than other areas of the pad electrode 385 in width excepting the other end of the pad electrode 385. The pad electrode 385 may have a shape that a predetermined area including one end or the other end thereof gradually decreases in a width.

For example, the pad electrode 385 may be a polygon that has more line segments than a rectangle, and the polygon may have at least one obtuse interior angle. An anisotropic conductive film (ACF) is coated and pressurized to connect a driving integrated circuit to the pad electrode 385. The flow of conductive balls of the ACF is disturbed at corers of the pad electrode 385. That is, since the conductive balls lumps together, shorts occur between pad electrodes, thereby reducing the reliability of the display device.

One interior angle θ of the pad electrode 385 may lie substantially in a range between 130° and 160°. If the interior angle θ is equal to or more than 130°, the short between pad electrodes is prevented because the flow of conductive balls of the ACF is not disturbed. If the interior angle θ is equal to or less than 160°, a pattern of the pad electrode 385 is lengthened, thereby preventing an increase in a resistance.

In the exemplary embodiment, the shape of the pad electrode 385 is defined to make conductive balls to smoothly flow, thereby preventing the short between the pad electrodes.

Figure 9:
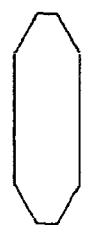
FIG. 9 illustrates various forms of a pad electrode of the display device according to the exemplary embodiment.
Figure 9:
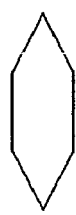
Figure 9:
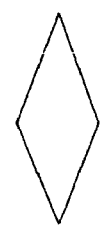

FIG. 9 illustrates various forms of a pad electrode of the display device according to the exemplary embodiment.

As shown in FIG. 9, the pad electrode of the pad unit according to the exemplary embodiment may have shapes (a), (b), and (c). That is, the pad electrode may be polygon having at least one obtuse interior angle. For example, the pad electrode may be an octagon like the shape (a) in FIG. 9, a hexagon like the shape (b) in FIG. 4, or a rectangle (c) in FIG. 4. The polygons have at least one obtuse interior angle.

However, the shape of the pad electrode according to the exemplary embodiment is not limited to the shapes (a), (b), and (c) of FIG. 9.

Figure 10:
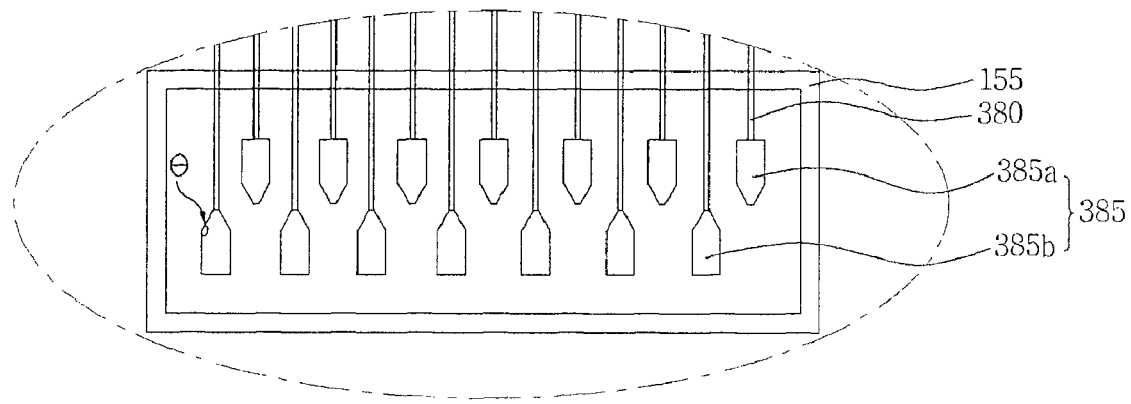
FIG. 10 is a plan view of an area A of FIG. 2 in a display device according to another exemplary embodiment.

FIG. 10 is a plan view of an area A of FIG. 2 in a display device according to another exemplary embodiment.

As shown in FIG. 10, a pad unit 350 of a display device includes a plurality of lines 380 disposed at a predetermined distance in one direction and applies a signal to a display unit 200.

A pad electrode 385 is disposed at one end of each line 380 connected to a driver 370. An insulating layer 155 is disposed around the pad unit 350 so as to expose the pad unit 350. The pad electrodes 385 may be connected to the driver 370 in later.

The pad electrode 385 includes a first pad electrode 385a disposed at a column close to the display unit 200 and a second pad electrode 385b disposed at a column far from the display unit 200.

More specifically, one end of the first pad electrode 385a close to the second pad electrode may be narrower than other areas of the first pad electrode 385a in a width excepting the other end of the first electrode 385a.

Also, on end of the second electrode 385b connected to the line 380 is narrower than other areas of the second pad electrode 385b in a width excepting the other end of the second pad electrode 385b.

One ends of the first and second pad electrodes 385a and 385b are identical to the other ends of the first and second pad electrodes 385a and 385b in a width. Also, the first and second pad electrode 385a and 385b have a shape that the width of a predetermined area including one end and the other end becomes narrower.

For example, the pad electrode 385 may be polygon that has more line segments than a rectangle and has at least one obtuse interior angle θ.

An ACF is coated and pressurized to connect a driving integrated circuit to the pad electrode 385. The flow of conductive balls of the ACF is disturbed at corners of the pad electrode 385. That is, since the conductive balls lumps together, shorts occur between pad electrodes, thereby degrading the reliability of a display device. The obtuse interior angle prevents the conductive balls from lumping together.

One interior angle θ of the pad electrode 385 may lie substantially in a range between 130° and 160°. If the interior angle θ is equal to or more than 130°, the short between pad electrodes is prevented because the flow of conductive balls of the ACF is not disturbed. If the interior angle θ is equal to or less than 160°, a pattern of the pad electrode 385 is lengthened, thereby preventing an increase in a resistance.

In case the pad electrodes are disposed at two or more columns, it can prevent shorts between the pad electrodes by lumped conductive balls that disturb the flow of conductive balls disposed around pad electrodes disposed on one column and the other column.

Figure 11:
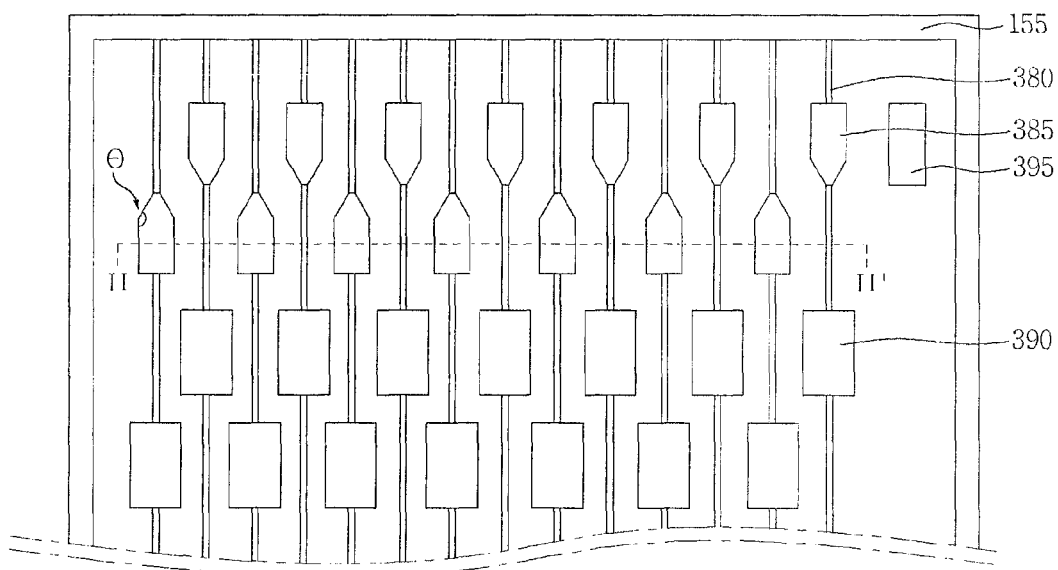
FIG. 11 is a plane view of a pad electrode of a display device according to another exemplary embodiment.

FIG. 11 is a plane view of a pad electrode of a display device according to another exemplary embodiment.

As shown in FIG. 11, a pad unit may further include a dummy pad electrode 390 for test. The dummy pad electrode 390 enables a test such as a turning on/off test to be performed at an original substrate without a driver packaged when the display device is manufactured. Therefore, the dummy pad electrode 390 may enable mass production and improve processing efficiency.

If a test jig is directly connected to a pad electrode when the test such as the turning on/off test is performed, a pad electrode is protected from being damaged. Therefore, it is possible to prevent the deterioration of an electric signal when the driver is packaged.

The dummy pad electrode 390 may be made of conductive material, for example, silver (Ag), molybdenum (Mo), titanium (Ti), and aluminum (Al).

An ACF verification pad electrode 395 may be disposed at one side of a pad unit where the pad electrodes 385 are disposed so as to detect an adhesive strength between the pad electrode 385 and an ACF.

The ACF verification pad electrode 395 is insulated from the display unit or the pad unit. In order to verify whether an ACF is adhered or not, nothing is disposed on the ACF verification pad electrode 395.

As described above, the display unit according to the exemplary embodiment includes the ACF verification pad electrode 395. Therefore, the reliability of the display unit can be improved by verifying an adhesive strength between the pad electrode 385 and the ACF.

The pad unit of the display unit according to the exemplary embodiment further includes a dummy pad electrode for test. Therefore, it is convenient to determine the deterioration of the display device by performing a predetermined test such as a turning on/off test, and the reliability of the display device can be improved by determining the adhesive strength between the pad electrode and the driver.

Hereinafter, a cross sectional structure of the pad unit of the display device and a method for manufacturing the pad unit of the display device will be described.

Figure 12:
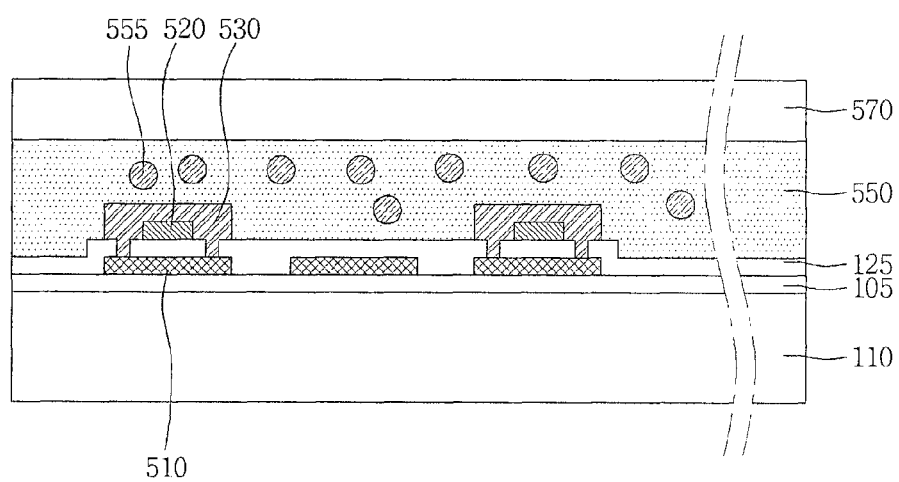
FIG. 12 a cross-sectional view of a pad unit taken along line II-II' of FIG. 11.

FIG. 12 is a cross-sectional view of a pad unit taken along line II-II' of FIG. 11.

A buffer layer 105 is disposed on a substrate 110. The buffer layer 105 prevents impurity penetrated from the substrate 110.

A first conductive layer 510 is disposed on the buffer layer 105 as a data pad line. The first conductive layer 510 may be formed at the same time when a gate electrode 120 of a thin film transistor is formed, and made of the same material as the gate electrode 120.

A second insulating layer 125 is disposed for insulating the first conductive layer 510. A second conductive layer 520 is disposed on the second insulating layer 125. The second conductive layer 520 is formed at the same time when a first electrode 150 of a light emitting diode is formed, and made of the same material as the first electrode 150. Further, the second conductive layer 520 is disposed at the bottom of a pad electrode to prevent a voltage drop due to line resistance. Therefore, a signal can be accurately transferred to elements of a display device without the signal deformed.

A third conductive layer 530 covers the second conductive layer 520 and is connected to the first conductive layer 510. The third conductive layer 530 is formed at the same time when a source electrode and a drain electrode of a thin film transistor of a display area 200 are formed and made of the same material as the source electrode and the drain electrode. The third conductive layer 530 is electrically connected to the first conductive layer 510 through a plurality of holes passing through the second insulating layer 125.

An ACF 550 is disposed on the second insulating layer 125, the third conductive layer 530 and the insulating layer 540. The ACF 550 may be a film obtained by distributing conductive balls 555 on a resin-based material having an adhesive property.

A driver 570 is disposed on the ACF 550. The driver 570 may be attached by coating and pressurizing the ACF 550 on the pad electrode. As described above, the shape of the pad electrode 385 improves the flow of the conductive balls 555 of the ACF 550, thereby improving the adhesive strength between the pad electrode 385 and the driver 570. Therefore, the display device according to the exemplary embodiment can prevent short between pad electrodes and improve the reliability thereof.

In the exemplary embodiment, the pad electrode connecting the display unit to the driver was described. However, a pad electrode connecting a pad unit to a driver can have the same structure as the exemplary embodiment.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A display device comprising:
   a substrate;
   a display unit on the substrate, the display unit including a plurality of subpixels;
   wherein each of the plurality of subpixels include a thin film transistor comprising a semiconductor layer, a gate insulating layer, a gate electrode, an interlayer insulating layer, a source electrode, and a drain electrode, and
   wherein each of the plurality of subpixels include a first electrode connected to the drain electrode, an organic light emitting layer, and a second electrode;
   a driver that applies a driving signal to the display unit;
   a pad unit that applies an electric signal received from the outside to the driver;
   a plurality of lines that connects the display unit to the driver; and
   a plurality of pad electrodes disposed at one ends of the lines connected to the driver,
   wherein each of the plurality of pad electrodes include:
      a first conductive layer including substantially a same material as the gate electrode;
      an interlayer insulating layer on the first conductive layer, the interlayer insulating layer exposing a portion of the first conductive layer;
      a second conductive layer on the interlayer insulating layer, the second conductive layer including the substantially same material as the first electrode; and
      a third conductive layer on the second conductive layer, the third conductive layer being connected to the first conductive layer by passing through the interlayer insulating layer,
   wherein the each of the pad electrode includes a first end connecting to the each line, a second end opposite to the first end, and a body area except the first and the second ends, and
   wherein widths of the first and the second ends are narrower than a width of the body area.

2. The display device of claim 1, a width of one end of the pad electrode is substantially equal to a width of the other end of the pad electrode.

3. The display device of claim 1, wherein a width of a predetermined area including one end of the pad electrode gradually decreases as it goes along the line.

4. The display device of claim 1, wherein a width of a predetermined area including the second end of the pad electrode gradually decreases as it goes along an opposite direction of a travelling direction of the line.

5. The display device of claim 1, wherein the pad electrode is a polygon that has more line segments than a rectangle, and has at least one obtuse interior angle.

6. The display device of claim 5, wherein at least one interior angle of the polygon lies substantially in a range between 130° and 160°.

7. The display device of claim 1, wherein at least one of the plurality of subpixels includes a phosphorescence material.

8. The display device of claim 1, wherein each of the plurality of pad electrodes include a plurality of conductive layers, and one of the plurality of conductive layers includes substantially a same material as the gate electrode or the substantially same material as the source electrode and the drain electrode.

9. The display device of claim 8, wherein one of the plurality of conductive layers includes the substantially same material as the first electrode.

10. The display device of claim 1, further comprising a dummy pad electrode for test, which is connected to the pad electrodes.

11. A display device comprising:
a substrate;
a display unit on the substrate, the display unit including a plurality of subpixels;
wherein each of the plurality of subpixels include a thin film transistor comprising a semiconductor layer, a gate insulating layer, a gate electrode, an interlayer insulating layer, a source electrode, and a drain electrode, and
wherein each of the plurality of subpixels include a first electrode connected to the drain electrode, an organic light emitting layer, and a second electrode;
a driver that applies a driving signal to the display unit;
a pad unit that applies an electric signal received from the outside to the driver;
a plurality of lines that connects the display unit to the driver; and
a plurality of pad electrodes disposed at one ends of the lines connected to the driver, the pad electrode including a first pad electrode disposed at a column close to the display unit and a second pad electrode disposed at a column father from the display unit than the first pad electrode,
wherein each of the plurality of pad electrodes include:
a first conductive layer including substantially a same material as the gate electrode;
an interlayer insulating layer on the first conductive layer, the interlayer insulating layer exposing a portion of the first conductive layer;
a second conductive layer on the interlayer insulating layer, the second conductive layer including substantially a same material as the first electrode; and
a third conductive layer on the second conductive laver, the third conductive layer being connected to the first conductive layer by passing through the interlayer insulating layer,
wherein a width of one end of the first pad electrode close to the second pad electrode is narrower than a width of other area of the first pad electrode except the other end of the first pad electrode, and
a width of one end of the second pad electrode connected to the line is narrower than a width of other area of the second pad electrode except the other end of the second pad electrode.

12. The display device of claim 11, wherein at least one of the plurality of subpixels includes a phosphorescence material.

13. The display device of claim 11, wherein a width of one end of each of the first electrode and the second electrode is substantially equal to a width of the other end of each of the first electrode and the second pad electrode.

14. The display device of claim 11, wherein a width of a predetermined area including one end of the second pad electrode and a width of a predetermined area including the other end of the first pad electrode gradually decrease as they go along the line.

15. The display device of claim 11, wherein a width of a predetermined area including the other end of the second pad electrode and a width of a predetermined area including one end of the first pad electrode gradually decrease as they go along an opposite direction of a travelling direction of the line.

16. The display device of claim 11, wherein the first electrode and the second electrode are a polygon that has more line segments than a rectangle, and have at least one obtuse interior angle.

17. The display device of claim 16, wherein at least one interior angle of the polygon lies substantially in a range between 130° and 160°.

18. The display device of claim 11, further comprising a dummy pad electrode for test, which is connected to the pad electrodes.

* * * * *